(12) United States Patent
Jiang (10) Patent No.: US 9,049,067 B2
(45) Date of Patent: Jun. 2, 2015

(54) RECEIVER INTERFACE

(75) Inventor: Jian Hong Jiang, Los Altos, CA (US)

(73) Assignee: FUJITSU LIMITED, Kawasaki (JP)

( * ) Notice: Subject to any disclaimer, the term of this patent is extended or adjusted under 35 U.S.C. 154(b) by 323 days.

(21) Appl. No.: 13/550,162

(22) Filed: Jul. 16, 2012

(65) Prior Publication Data

US 2014/0016683 A1 Jan. 16, 2014

(51) Int. Cl.
*H03H 7/38* (2006.01)
*H04L 25/02* (2006.01)

(52) U.S. Cl.
CPC ............... *H04L 25/028* (2013.01); *H03H 7/38* (2013.01); *H04L 25/0278* (2013.01); *H04L 25/0282* (2013.01); *H04L 25/0298* (2013.01)

(58) Field of Classification Search
USPC .............................................. 333/33, 32, 124
See application file for complete search history.

(56) References Cited

U.S. PATENT DOCUMENTS

2007/0063788 A1* 3/2007 Zhu et al. ........................ 333/32
2011/0248811 A1* 10/2011 Kireev ........................... 336/200

OTHER PUBLICATIONS

Galal, "Broadband ESD Protection Circuits in CMOS Technology" IEEE Journal of Solid-State Circuits, Dec. 2003, vol. 38, No. 12, pp. 2334-2340.

* cited by examiner

*Primary Examiner* — Stephen E Jones
*Assistant Examiner* — Scott S Outten
(74) *Attorney, Agent, or Firm* — Maschoff Brennan (57) ABSTRACT

In an embodiment, a circuit may include an input node, an output node, an internal node, a compensation circuit, and an adjustable capacitance circuit. The compensation circuit may be configured to modify a return loss of a signal received at the input node. The compensation circuit may include a first inductive element, a second inductive element, and a capacitive element. The first inductive element may couple the input node and the output node. The second inductive element may couple the output node and the internal node. The capacitive element may couple the input node and the internal node. The adjustable capacitance circuit may be configured to adjustably modify the return loss of the signal received at the input node. The capacitance circuit may be coupled to the compensation circuit.

18 Claims, 6 Drawing Sheets

RECEIVER INTERFACE

FIELD

The embodiments discussed herein are related to receiver interfaces.

BACKGROUND

When receiving high-speed data, a receiver's input may suffer from impedance mismatch with a transmission line that supplies a signal to the receiver's input. The impedance mismatch may be due to differences in an impedance of the transmission line and an impedance of the receiver's input. The impedance mismatch may cause one or more signal reflections of the signal that may result in signal loss and may distort incoming data. The result of signal reflections on a signal may be quantified as a return loss of the signal. When designing receivers for high speed data connections, and especially receiver interfaces for high speed data connections, various configurations of active and/or passive circuit elements may be used in a receiver interface to reduce the return loss of the signal received at the receiver interface.

The amount of return loss in receivers may vary based on the transmission line, the receiver design, and other factors. To reduce problems with varying return loss between different receivers some institutions, such as the Institute of Electrical and Electronics Engineers (IEEE), provide standards that specify a maximum return loss at receivers for a particular frequency range. Many receivers are designed to comply with these standards to provide interoperability between the receivers and other circuitry.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include an input node, an output node, an internal node, a compensation circuit, and an adjustable capacitance circuit. The compensation circuit may be configured to modify a return loss of a signal received at the input node. The compensation circuit may include a first inductive element, a second inductive element, and a capacitive element. The first inductive element may couple the input node and the output node. The second inductive element may couple the output node and the internal node. The capacitive element may couple the input node and the internal node. The adjustable capacitance circuit may be coupled to the compensation circuit and may be configured to adjustably modify the return loss of the signal received at the input node.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

A solution for reducing an impedance mismatch between a receiver interface and a transmission line, and thus a return loss of the signal received at the receiver interface, may include providing a t-coil circuit in the receiver interface. Some models for selecting the parameters of a t-coil circuit in a receiver interface may be based on an estimated lumped capacitance located at an output node of the receiver interface. The models based on an estimated lumped capacitance may not adequately account for all capacitances of the receiver interface over a desired frequency range, particularly when high-speed signals are received at the receiver interface. These unaccounted-for capacitances may cause the return loss of the signal received at the receiver interface to be higher than the model may predict. Having a higher than expected return loss may cause the return loss to exceed a return loss threshold set by a standard, which may cause the receiver interface to be incompatible with other circuits. Even when accounting for all capacitances, however, the return loss of the signal received at the receiver interface may still exceed the return loss threshold due to manufacturing variances and the like.

In some embodiments, to more accurately model a receiver interface with a t-coil circuit, an input capacitance, an output capacitance, and an internal capacitance estimated to be exhibited, respectively, at an input node, an output node, and an internal node of the receiver interface may be used.

To account for manufacturing variances and the like that may cause a return loss of the signal received at the receiver interface to exceed a return loss threshold, an adjustable capacitance circuit may be included in the receiver interface. The adjustable capacitance circuit may be configured to modify the return loss of a signal received at the receiver interface by adjusting a capacitance of the adjustable capacitance circuit so that the return loss may be brought under the return loss threshold over a desired frequency range.

Embodiments of the present invention will be explained with reference to the accompanying drawings.

Figure 1A:
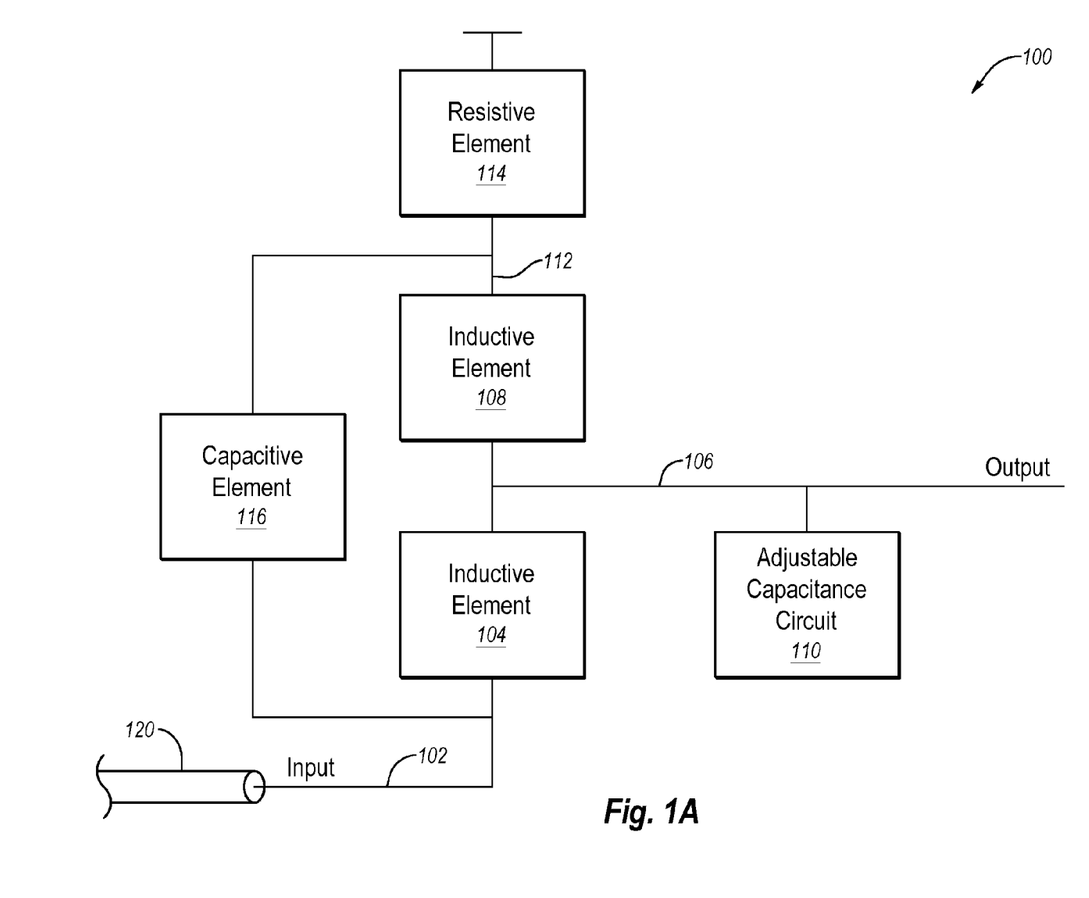
FIG. 1A is a block diagram of an example receiver interface circuit.

FIG. 1A is a block diagram of an example receiver interface circuit 100, arranged in accordance with at least some embodiments described herein. In some embodiments, the receiver interface circuit 100 may be located at a receiver interface (not illustrated) of a data-receiving device (not illustrated). By way of example and not limitation, the receiver interface circuit 100 may be located at an interface of a 10 gigabit-per-second (Gbps) Ethernet port. In some embodiments, the receiver interface circuit 100 may be located at each signal interface of a differential signal interface.

The receiver interface circuit 100 may include an input node 102, which may be configured to be coupled to a transmission line 120. The input node 102 may receive a high-speed signal from the coupled transmission line 120. For example, the input node 102 may receive signals having frequencies from about 1 gigahertz (GHz) to about 40 GHz.

The input node 102 may be coupled to an inductive element 104. The inductive element 104 may be coupled to an output node 106. Generally, the output node 106 may be coupled to a circuitry (not illustrated) configured to process the signal received at the input node 102. The output node 106 may be coupled to another inductive element 108. The inductive element 108 may be coupled to an internal node 112.

In these and other embodiments, a capacitive element 116 may couple the input node 102 and the internal node 112. The parameters of the inductive elements 104, 108 and the capacitive element 116, that is the inductance of each of the inductive elements 104, 108 and the capacitance of the capacitive element 116, may modify a return loss of the signal received at the receiver interface circuit 100. In some embodiments, the inductive elements 104, 108 and the capacitive element 116 may be formed as part of a t-coil network. Selecting parameters for a t-coil network to modify a return loss of a signal received at the receiver interface circuit 100 in some embodiments is described herein with reference to FIG. 3.

The internal node 112 may be coupled to a resistive element 114. The resistive element 114 may be a terminating resistor. For example, the resistive element 114 may be a fifty-ohm resistor coupled to a supply voltage of the receiver interface circuit 100. The resistive element 114 may provide a resistive impedance to match the transmission line 120 impedance and reduce return loss of the signal received at the input node 102.

The receiver interface circuit 100 may include an adjustable capacitance circuit 110. The return loss of the signal received at the receiver interface circuit 100 over a frequency range may be influenced by the capacitance contributed by the adjustable capacitance circuit 110. The adjustable capacitance circuit 110 may allow the capacitance contributed by the adjustable capacitance circuit 110 to be adjusted. The capacitance of the adjustable capacitance circuit 110 may be adjusted to a value such that the return loss of the signal received at the input node 102 is modified. In some embodiments, the capacitance of the adjustable capacitance circuit 110 may be adjusted so the return loss of the signal received at the receiver interface circuit 100 is under a return loss threshold over a frequency range. In some embodiments, the adjustable capacitance circuit 110 may be coupled to the output node 106.

Figure 1B:
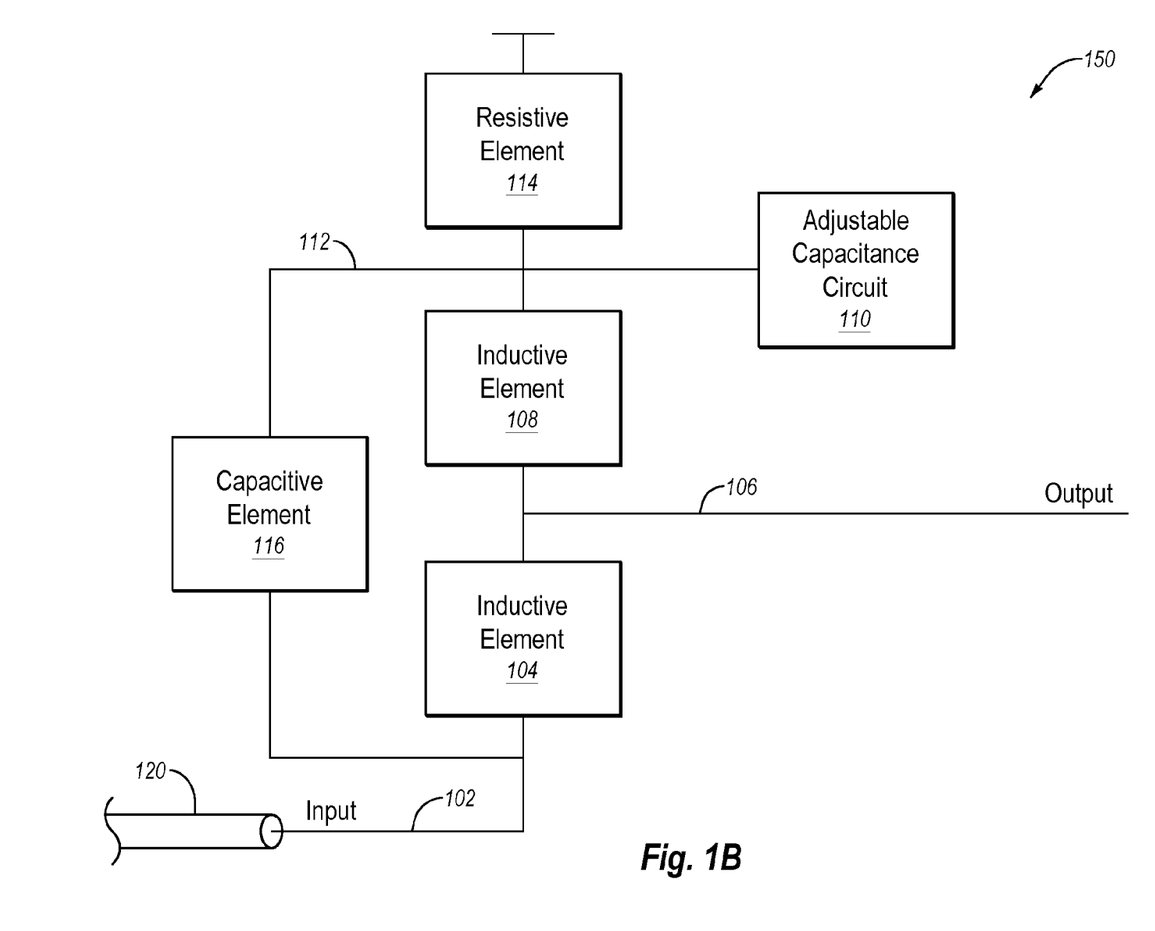
FIG. 1B is a block diagram of another example receiver interface circuit.

FIG. 1B is a block diagram of another example receiver interface circuit 150, arranged in accordance with at least some embodiments described herein. The receiver interface circuit 150 may include an input node 102; a transmission line 120; inductive elements 104, 108; an output node 106; an adjustable capacitance circuit 110; an internal node 112; a resistive element 114, and a capacitive element 116. The input node 102; the transmission line 120; the inductive elements 104, 108; the output node 106; the adjustable capacitance circuit 110; the internal node 112; the resistive element 114; and the capacitive element 116 may be similar to and/or may generally correspond to the input node 102; the transmission line 120; the inductive elements 104, 108; the output node 106; the adjustable capacitance circuit 110; the internal node 112; the resistive element 114; and the capacitive element 116, respectively, of FIG. 1A.

The adjustable capacitance circuit 110 may be coupled to the internal node 112. In some embodiments, the adjustable capacitance circuit 110 may be coupled to other nodes of the receiver interface circuit, including the input node 102.

Figure 2:
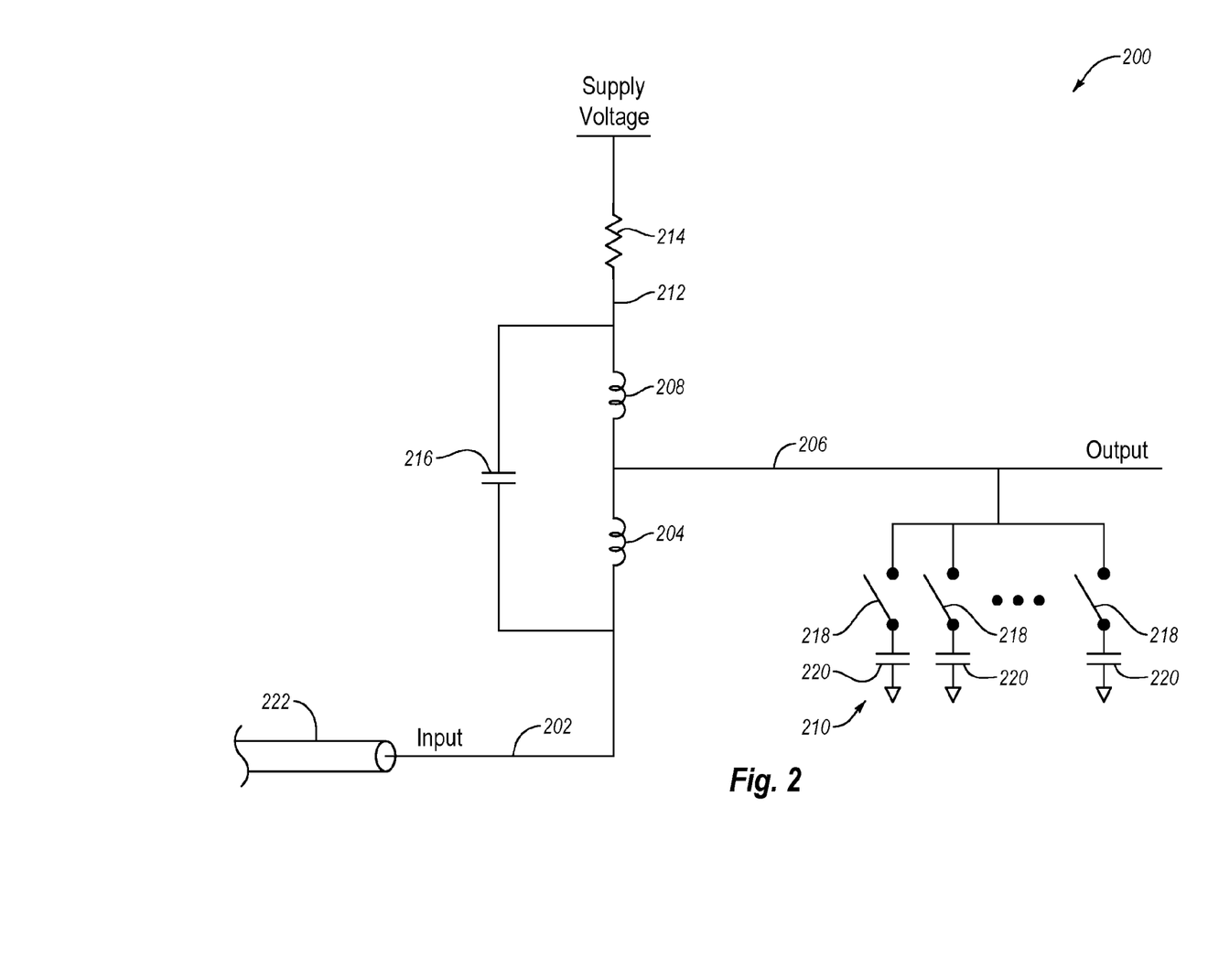
FIG. 2 is a circuit diagram of an example embodiment of the receiver interface circuit of FIG. 1A.

FIG. 2 is a circuit diagram 200 of an example embodiment of the receiver interface circuit 100 of FIG. 1A, arranged in accordance with at least some embodiments described herein. FIG. 2 illustrates a circuit diagram 200 including an input node 202; a transmission line 222; inductive elements 204, 208; an output node 206; an adjustable capacitance circuit 210; an internal node 212; a resistive element 214; and a capacitive element 216. The input node 202; the transmission line 222; the inductive elements 204, 208; the output node 206; the adjustable capacitance circuit 210; the internal node 212; the resistive element 214; and the capacitive element 216 may be similar to or may generally correspond to the input node 102; the transmission line 120; the inductive elements 104, 108; the output node 106; the adjustable capacitance circuit 110; the internal node 112; the resistive element 114; and the capacitive element 116, respectively, of FIG. 1A. In some embodiments, the resistive element 214 may be coupled to a supply voltage.

The adjustable capacitance circuit 210 may include multiple switches 218 coupled to multiple capacitors 220. As illustrated, the switches 218 may allow the capacitors 220 to be selectively coupled to the output node 206 of the receiver interface circuit 200. Selectively coupling the capacitors 220 to the receiver interface circuit 200 may allow the capacitance contributed by the adjustable capacitance circuit 210 to be adjusted. In some embodiments, each of the capacitors 220 may have different capacitance values to allow the capacitance contributed by the adjustable capacitance circuit 210 to be finely tuned to a particular capacitance value. Alternately or additionally, the capacitors 220 may have the same or similar capacitance values to allow the capacitance contributed by the adjustable capacitance circuit 210 to be steadily increased or decreased by closing or opening the switches 218.

The return loss of the signal received at the receiver interface circuit 200 over a frequency range may be influenced by the capacitance contributed by the adjustable capacitance circuit 210. In some embodiments, the switches 218 may be opened and/or closed to adjust the capacitance of the adjustable capacitance circuit 210 so that the return loss of the signal received at the receiver interface circuit 200 is under a return loss threshold over a frequency range.

In some embodiments, the adjustable capacitance circuit 210 may be coupled to the internal node 212. In these and other embodiments, the switches 218 may allow the capacitors 220 to be selectively coupled to the internal node 212.

Figure 3:
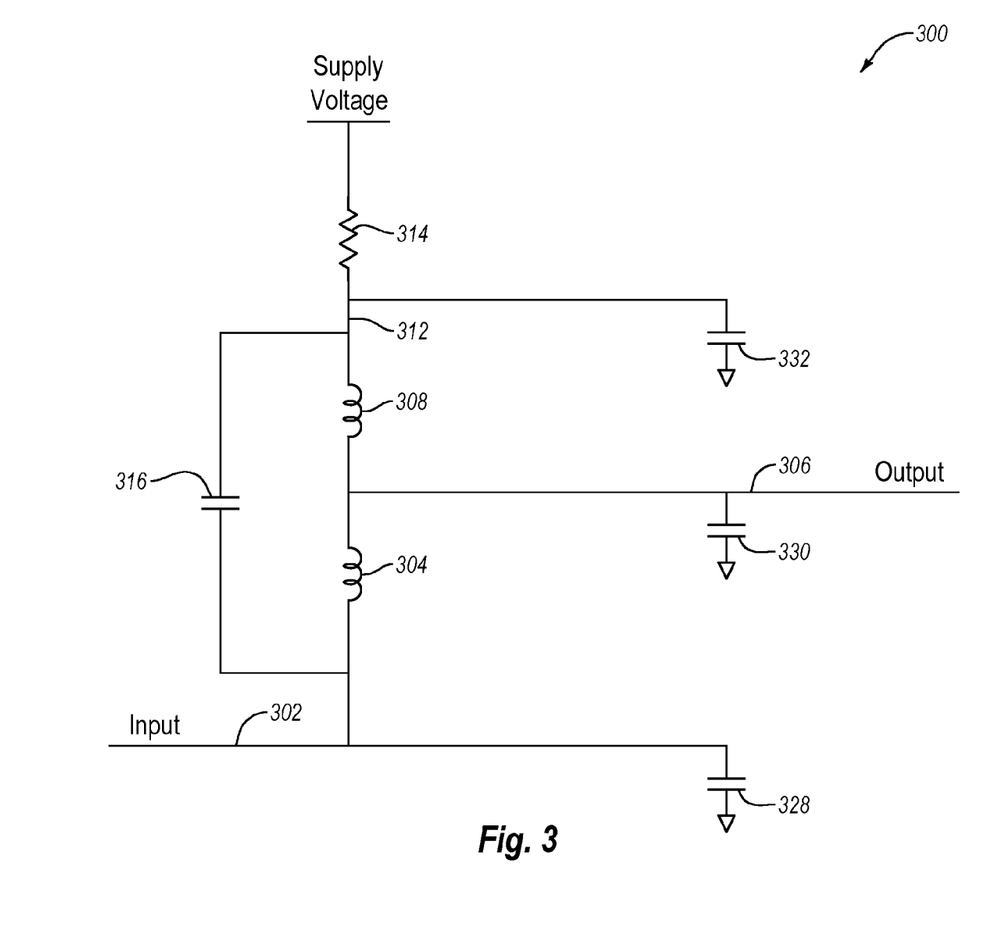
FIG. 3 is a model circuit diagram including estimated capacitances of the receiver interface circuits of FIGS. 1A, 1B, and 2.

FIG. 3 is a model circuit diagram 300 including estimated capacitances of the receiver interface circuits of FIGS. 1A, 1B, and 2, arranged in accordance with at least some embodiments described herein. FIG. 3 illustrates a model circuit diagram 300 that includes actual physical components and modeled components that may be used to model capacitances, inductances, resistances, and other parameters that naturally occur and/or inherent in electronic circuits, such as parasitic capacitances.

The model circuit diagram 300 may include actual physical components such as inductive elements 304, 308; a resistive element 314; and a capacitive element 316 that may be similar to and/or corresponding to the inductive elements 104, 108; the resistive element 114; and the capacitive element 116 of FIGS. 1A and 1B. The inductive element 304 may be coupled between an input node 302 and an output node 306. The inductive element 306 may be coupled between the output node 306 and the internal node 312. The resistive element 314 may be coupled between a supply voltage and the internal node 312. The capacitive element 316 may be coupled between the internal node 312 and the input node 302.

The model circuit diagram 300 may also include modeled components such as an estimated input capacitance 328, an estimated output capacitance 330, and an estimated internal capacitance 332. The estimated input capacitance 328 may represent an estimated inherent capacitance of the input node 302. For example, the estimated input capacitance 328 may represent an estimated parasitic capacitance at the input node 302. The estimated input capacitance 328 may be signal frequency dependent.

The estimated output capacitance 330 may represent an estimated inherent capacitance of the output node 306. For example, the estimated output capacitance 330 may represent an estimated parasitic capacitance of the output node 306 plus a default capacitance of an adjustable capacitance circuit. The estimated output capacitance 330 may be signal frequency dependent. In some embodiments, the estimated output capacitance 330 may further include a load capacitance of a load coupled to the output node 306.

The estimated internal capacitance 332 may represent an estimated inherent capacitance of the internal node 312. For example, the estimated internal capacitance 332 may represent an estimated parasitic capacitance of the internal node 312 plus a default capacitance of an adjustable capacitance circuit. The estimated internal capacitance 332 may be signal frequency dependent.

In some embodiments, if an adjustable capacitance circuit is to be coupled to the output node 306, and/or the internal node 312 of a receiver interface circuit represented by the model circuit diagram 300, the estimated capacitance(s) of the respective node(s) may additionally represent a default value of the adjustable capacitance circuit. For example, the estimated input capacitance 328, estimated output capacitance 330, and/or estimated internal capacitance 332 may additionally represent a median capacitance value that may be achieved by the adjustable capacitance circuit to be coupled to the respective node. Modeling the estimated capacitances to additionally represent a default value of the adjustable capacitance circuit to be coupled to the respective node may allow the adjustable capacitance circuit in the receiver interface circuit represented by the model circuit diagram 300 to be set to the default value and to be adjusted either up or down as needed.

Values of the inductors 304, 308 and the capacitive element 316 may be selected such that an estimated return loss of a signal received at the receiver interface circuit represented by the model circuit diagram 300 is under a return loss threshold over a frequency range. The values of the inductors 304, 308 and the capacitive element 316 may be based on the values of the estimated input capacitance 328, the estimated output capacitance 330, the internal capacitance 332, the resistive element 314, and a mutual inductance between the inductors 304, 308. In some embodiments, values of the inductors 304, 308 and the capacitive element 316 may be selected, such that an estimated return loss of a signal received at the receiver interface circuit represented by the model circuit diagram 300 is under the return loss threshold over a frequency range, with the aid of a circuit analysis program, a circuit simulator, or the like.

Figure 4:
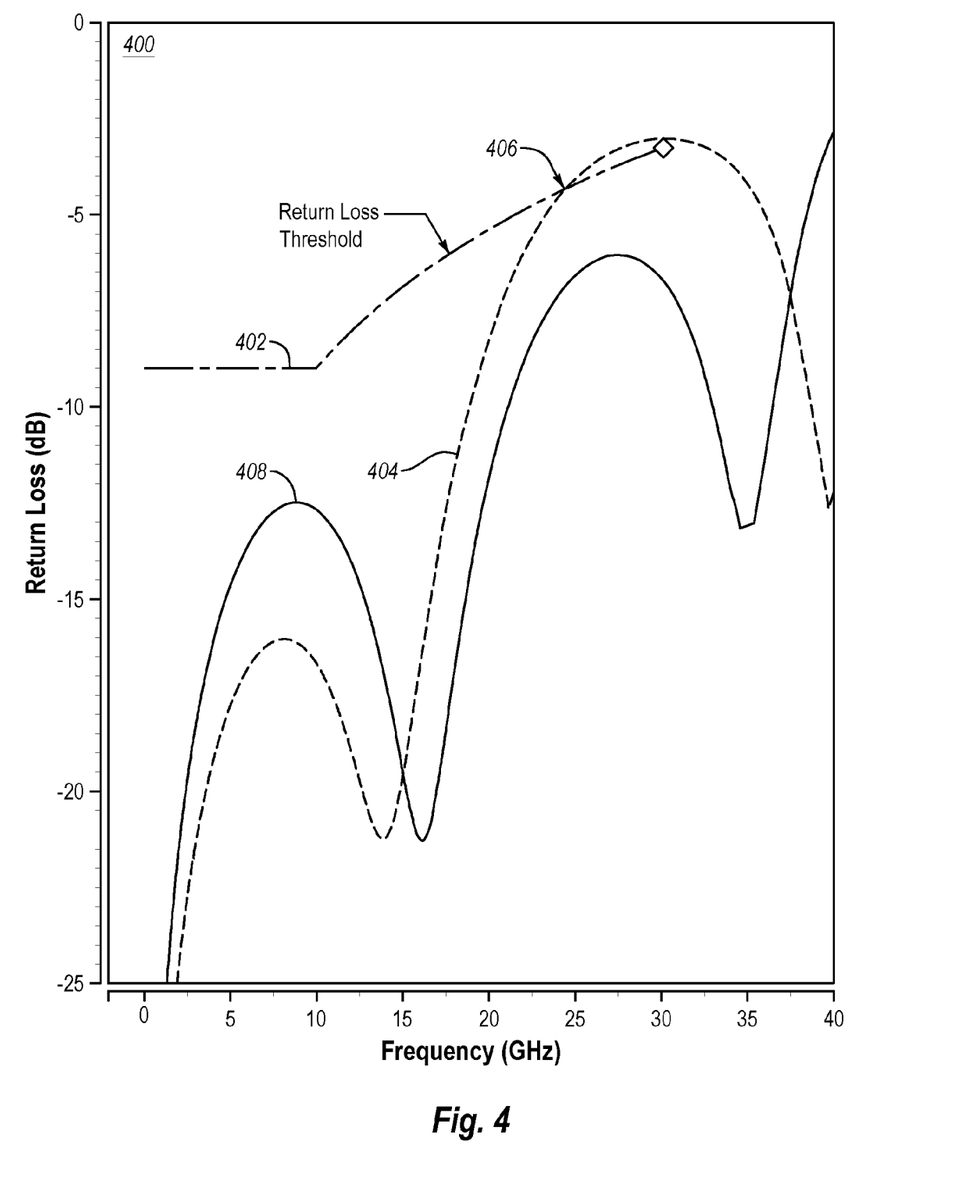
FIG. 4 is a plot of example return loss characteristics of a signal at a receiver interface circuit.

FIG. 4 is a plot 400 of example return loss characteristics of a signal at a receiver interface circuit. The vertical axis of the plot 400 may represent return loss in decibels (dB) on a linear scale. The horizontal axis of the plot 400 may represent a frequency of a signal received at the receiver interface circuit in GHz received at the input node of the receiver interface circuit. The plot 400 may include a return loss threshold 402 defined by a standard over a frequency range.

A line 404 may represent an unadjusted return loss of the signal at the receiver interface circuit. As illustrated, the line 404 equals the return loss threshold 402 at point 406 and exceeds the return loss threshold 402 for frequencies between approximately 23 GHz to 30 GHz.

A line 408 may represent an adjusted return loss of the signal at the receiver interface circuit. As illustrated, the line 408 stays below the return loss threshold 402 for frequencies at least below 40 GHz. As discussed above, the adjusted return loss of the signal may be achieved by adding additional capacitance to an output node of the receiver interface circuit using an adjustable capacitance circuit. As an example, to achieve the change illustrated between the line 404 and the line 408, the capacitance of the output node of the receiver interface circuit may be increased by 40% by the adjustable capacitance circuit. In other embodiments, decreasing the capacitance may cause the return loss to be under the return loss template.

Figure 5:
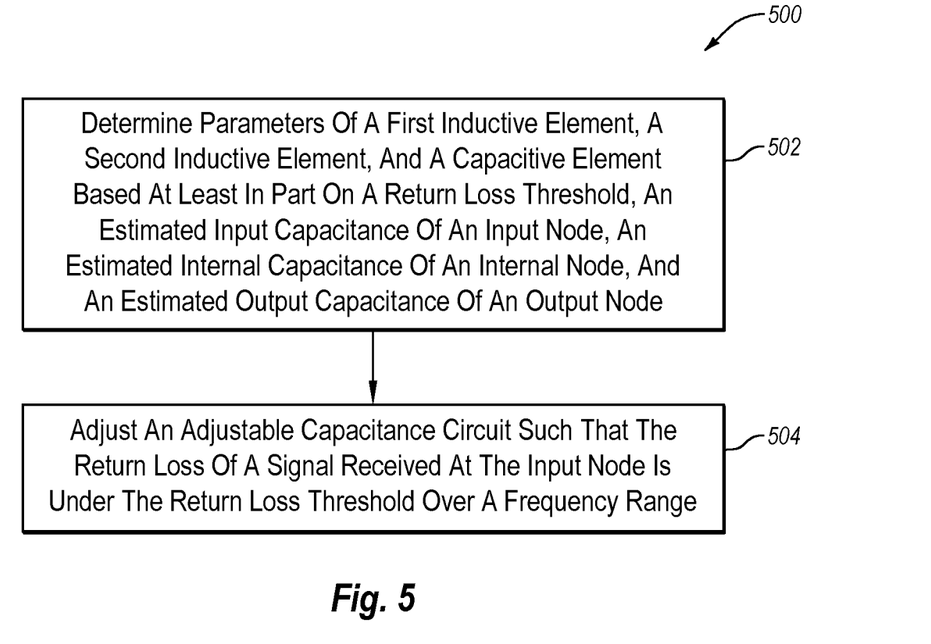
FIG. 5 is a flowchart of an example method of modifying a return loss of a signal.

FIG. 5 is a flowchart of a method 500 for modifying a return loss of a signal, arranged in accordance with at least some described herein. The method 500 may be implemented, in some embodiments, by and/or on the receiver interface circuits 100, 150, or 200 of FIG. 1A, 1B, or 2, respectively. Although FIG. 5 is illustrated as discrete blocks, various blocks may be divided into additional blocks, combined into fewer blocks, or eliminated, depending on the desired implementation.

The method 500 may begin at block 502, in which, parameters of a first inductive element, a second inductive element, and a capacitive element may be determined based at least in part on a return loss threshold, an estimated input capacitance of the input node, an estimated internal capacitance of an internal node, and an estimated output capacitance of an output node. The first inductive element may be coupled to the input node and the output node of the receiver interface circuit. The second inductive element may be coupled to the output node and the internal node of the receiver interface circuit. The capacitive element may be coupled to the input node and the output node of the receiver interface circuit. In some embodiments, the first inductive element, the second inductive element, and the capacitive element may be configured as a t-coil network.

In block 504, an adjustable capacitance circuit of the receiver interface circuit may be adjusted such that the return loss of a signal received at the input node is under the return loss threshold over a frequency range. The adjustable capacitance circuit may be coupled to at least one of the first inductive element and the second inductive element. In some embodiments, adjusting the adjustable capacitance circuit may include selectively coupling at least one of a plurality of capacitors to at least one of the first inductive element and the second inductive element. Alternately or additionally, adjusting the adjustable capacitance circuit may include varying a capacitance of a variable capacitor or varying a capacitance of an active circuit element, such as a varactor, transistor, or other active circuit element.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 500 may further include detecting the return loss of the signal received at the input node of the receiver interface circuit. The detected return loss may be used to adjust the adjustable capacitance circuit such that the return loss of the signal received at the input node is under the return loss threshold over the frequency range.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
    an input node;
    an output node;
    an internal node;
    a compensation circuit configured to modify a return loss of a signal received at the input node, the compensation circuit including:
        a first inductive element coupling the input node and the output node,
        a second inductive element coupling the output node and the internal node, and
        a fixed capacitive element coupling the input node and the internal node; and
    an adjustable capacitance circuit directly coupled to at least one of the internal node and the output node, the adjustable capacitance circuit configured to adjustably modify the return loss of the signal.

2. The circuit of claim 1, wherein the compensation circuit comprises a t-coil network.

3. The circuit of claim 1, wherein a first inductance of the first inductive element and a second inductance of the second inductive element are substantially equal.

4. The circuit of claim 1, wherein the adjustable capacitance circuit comprises a plurality of capacitors and a plurality of switches, the plurality of capacitors and the plurality of switches configured to allow one or more of the plurality of capacitors to be selectively coupled to at least one of the internal node and the output node.

5. The circuit of claim 1, wherein the adjustable capacitance circuit comprises a variable capacitor or an active circuit element.

6. The circuit of claim 1, wherein the adjustable capacitance circuit is configured to adjustably modify the return loss of the signal so that the return loss is under a return loss threshold over a frequency range.

7. The circuit of claim 1, wherein the input node is configured to be coupled to a high-speed transmission line.

8. The circuit of claim 1, wherein the adjustable capacitance circuit is coupled to at least one of the first inductive element and the second inductive element.

9. The circuit of claim 1, further comprising a resistive element coupled to the internal node and to a supply voltage.

10. The circuit of claim 1, wherein the first inductive element and the second inductive element are configured based at least in part on:
    an estimated input capacitance of the input node,
    an estimated internal capacitance of the internal node, and
    an estimated output capacitance of the output node.

11. A circuit comprising:
    an input node configured to be coupled to a transmission line, the input node further configured to receive a signal from the transmission line at a frequency above about a gigahertz;
    an output node;
    a supply voltage;
    a resistive element coupled to the supply voltage and to an internal node;
    a t-coil network including:
        a first inductive element coupling the input node and the output node,
        a second inductive element coupling the output node and the internal node, and
        a fixed capacitive element coupling the input node and the internal node,
        a first inductance of the first inductive element and a second inductance of the second inductive element selected based at least in part on:
            an estimated input capacitance of the input node,
            an estimated internal capacitance of the internal node, and
            an estimated output capacitance of the output node; and
    an adjustable capacitance circuit configured to adjustably modify a return loss of the signal received at the input node, the adjustable capacitance circuit directly coupled to at least one of the internal node and the output node.

12. The circuit of claim 11, wherein the adjustable capacitance circuit comprises a plurality of capacitors and a plurality of switches, the plurality of capacitors and the plurality of switches configured to allow one or more of the plurality of capacitors to be selectively coupled to at least one of the internal node and the output node.

13. The circuit of claim 11, wherein the adjustable capacitance circuit comprises a variable capacitor or an active circuit element.

14. The circuit of claim 11, wherein:
    the first inductance and the second inductance are selected based at least in part on a return loss threshold, and
    the adjustable capacitance circuit is configured to adjustably modify the return loss of the signal so that the return loss is under the return loss threshold over a frequency range.

15. A method of modifying a return loss of a signal received at an input node, the method comprising:
    determining parameters of:
        a first inductive element coupled to the input node and an output node,
        a second inductive element coupled to the output node and an internal node, and
        a fixed capacitive element coupled to the input node and the output node, based at least in part on:
        a return loss threshold,
        an estimated input capacitance of the input node,
        an estimated internal capacitance of the internal node, and
        an estimated output capacitance of the output node; and
    adjusting an adjustable capacitance circuit such that the return loss of the signal received at the input node is under the return loss threshold over a frequency range, the adjustable capacitance circuit directly coupled to at least one of the internal node and the output node.

16. The method of claim 15, wherein the first inductive element, the second inductive element, and the capacitive element are configured as a t-coil network.

17. The method of claim 15, wherein adjusting the adjustable capacitance circuit includes selectively coupling at least one of a plurality of capacitors to at least one of the first inductive element and the second inductive element.

18. The method of claim 15, wherein adjusting the adjustable capacitance circuit includes varying a capacitance of a variable capacitor or varying a capacitance of an active circuit element.

\* \* \* \* \*